(12) United States Patent
Nataraj et al.

(10) Patent No.: US 7,920,399 B1
(45) Date of Patent: Apr. 5, 2011

(54) LOW POWER CONTENT ADDRESSABLE MEMORY DEVICE HAVING SELECTABLE CASCADED ARRAY SEGMENTS

(75) Inventors: Bindiganavale S. Nataraj, Cupertino, CA (US); Vinay Iyengar, Cupertino, CA (US); Chetan Deshpande, San Jose, CA (US); Sandeep Khanna, Los Altos, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/909,701

(22) Filed: Oct. 21, 2010

(51) Int. Cl.
*G11C 15/00* (2006.01)
(52) U.S. Cl. ................... 365/49.16; 365/49.1; 365/49.18
(58) Field of Classification Search ............... 365/49.1, 365/19.16, 19.18
See application file for complete search history.

(56) References Cited

U.S. PATENT DOCUMENTS

| | | | |
|---|---|---|---|
| 4,244,033 A | 1/1981 | Hattori | |
| 4,656,626 A | 4/1987 | Yudichak et al. | |
| 4,670,858 A | 6/1987 | Almy | |
| 4,813,002 A | 3/1989 | Joyce et al. | |
| 4,845,668 A | 7/1989 | Sano et al. | |
| 4,888,731 A | 12/1989 | Chuang et al. | |
| 4,958,377 A | 9/1990 | Takahashi | |
| 4,959,811 A | 9/1990 | Szczepanek | |
| 4,996,666 A | 2/1991 | Duluk, Jr. | |
| 5,053,991 A | 10/1991 | Burrows | |
| 5,123,105 A | 6/1992 | Wyland et al. | |
| 5,319,589 A | 6/1994 | Yamagata et al. | |
| 5,383,146 A | 1/1995 | Threewitt | |
| 5,388,066 A | 2/1995 | Hamamoto et al. | |
| 5,440,715 A | 8/1995 | Wyland | |
| 5,440,753 A | 8/1995 | Hou et al. | |
| 5,448,733 A | 9/1995 | Satoh et al. | |
| 5,485,418 A | 1/1996 | Hiraki et al. | |
| 5,513,134 A | 4/1996 | Cooperman et al. | |
| 5,524,231 A | 6/1996 | Brown | |
| 5,555,397 A | 9/1996 | Sasama et al. | |
| 5,642,322 A | 6/1997 | Yondea | |

(Continued)

FOREIGN PATENT DOCUMENTS

EP    0 381 249    8/1990

(Continued)

OTHER PUBLICATIONS

EPO Search Report dated Feb. 12, 2002 for PCT Application No. PCT/US01/18736.

*Primary Examiner* — Huan Hoang
*Assistant Examiner* — Jason Lappas
(74) *Attorney, Agent, or Firm* — Mahamedi Paradice Kreisman LLP; William L. Paradice, III

(57) ABSTRACT

A content addressable memory (CAM) device includes a CAM array and a configuration circuit. The CAM array has a plurality of rows of CAM cells, each row segmented into a plurality of row segments, each row segment including a plurality of CAM cells coupled to a corresponding match line segment, and a match line control circuit having an input coupled to the corresponding match line segment, an output coupled to the match line segment in a next row segment, and a control terminal to receive a corresponding enable signal. The configuration circuit has an input to receive configuration information indicative of a width and depth configuration of the CAM array and having outputs to generate the enable signals.

24 Claims, 7 Drawing Sheets

U.S. PATENT DOCUMENTS

| | | |
|---|---|---|
| 5,649,149 A | 7/1997 | Stormon et al. |
| 5,706,224 A | 1/1998 | Srinivasan et al. |
| 5,726,942 A | 3/1998 | Yoneda et al. |
| 5,818,786 A | 10/1998 | Yoneda |
| 5,828,593 A | 10/1998 | Schultz et al. |
| 5,860,085 A | 1/1999 | Stormon et al. |
| 5,870,324 A | 2/1999 | Helwig et al. |
| 5,920,886 A | 7/1999 | Feldmeier |
| 5,946,704 A | 8/1999 | Yoneda et al. |
| 5,999,435 A | 12/1999 | Henderson et al. |
| 6,044,005 A | 3/2000 | Gibson et al. |
| 6,081,442 A | 6/2000 | Igarashi et al. |
| 6,125,049 A | 9/2000 | Nataraj |
| 6,147,891 A | 11/2000 | Nataraj |
| 6,166,939 A | 12/2000 | Nataraj et al. |
| 6,191,969 B1 | 2/2001 | Pereira |
| 6,191,970 B1 | 2/2001 | Pereira |
| 6,195,278 B1 | 2/2001 | Calin et al. |
| 6,243,280 B1 | 6/2001 | Wong et al. |
| 6,275,426 B1 | 8/2001 | Srinivasan et al. |
| 6,324,087 B1 | 11/2001 | Pereira |
| 6,430,074 B1 | 8/2002 | Srinivasan |
| 6,470,418 B1 | 10/2002 | Lien et al. |
| 6,487,131 B1 | 11/2002 | Clark et al. |
| 6,687,785 B1 | 2/2004 | Pereira |
| 6,697,276 B1 | 2/2004 | Pereira et al. |
| 6,760,242 B1 | 7/2004 | Park et al. |
| 6,763,425 B1 | 7/2004 | Periera |
| 6,768,659 B2 | 7/2004 | Gillingham et al. |
| 6,804,133 B1 | 10/2004 | Khanna |
| 6,804,134 B1 | 10/2004 | Proebstiing et al. |
| 6,829,153 B1 | 12/2004 | Park et al. |
| 6,867,991 B1 | 3/2005 | Tezcan et al. |
| 6,934,795 B2 | 8/2005 | Nataraj et al. |
| 6,944,709 B2 | 9/2005 | Nataraj et al. |
| 6,965,519 B1 | 11/2005 | Park et al. |
| 6,967,856 B1 | 11/2005 | Park et al. |
| 6,972,978 B1 | 12/2005 | Miller et al. |
| 7,043,601 B2 | 5/2006 | McKenzie et al. |
| 7,096,318 B2 | 8/2006 | Jalowiecki et al. |
| 7,113,415 B1 | 9/2006 | Khanna |
| 7,185,141 B1 | 2/2007 | James et al. |
| 7,193,874 B1 | 3/2007 | Pereira et al. |
| 7,219,188 B1 | 5/2007 | Pereira |
| 7,251,707 B1 | 7/2007 | Pereira |
| 7,325,091 B2 | 1/2008 | Pereira |
| 7,694,068 B1 | 4/2010 | Rosman |
| 7,800,930 B1 | 9/2010 | Deshpande et al. |
| 7,848,129 B1 * | 12/2010 | Deshpande et al. ....... 365/49.17 |
| 7,852,652 B1 | 12/2010 | Fabry |

FOREIGN PATENT DOCUMENTS

| | | |
|---|---|---|
| EP | 0 774 758 | 6/1998 |
| EP | 0 872 802 | 10/1998 |
| EP | 0 918 335 | 8/1999 |
| EP | 1 713 082 | 10/2006 |
| JP | 07 021785 | 1/1995 |
| JP | 08 273376 | 10/1996 |

* cited by examiner

LOW POWER CONTENT ADDRESSABLE MEMORY DEVICE HAVING SELECTABLE CASCADED ARRAY SEGMENTS

TECHNICAL FIELD

This disclosure relates generally to content addressable memory (CAM) devices and specifically to power saving techniques in CAM devices achieved through avoid duplicate search operations.

BACKGROUND OF RELATED ART

Content addressable memory (CAM) devices are frequently used in network switching and routing applications to determine forwarding destinations for data packets, and are also used to provide more advanced network Quality of Service (QoS) functions such as traffic shaping, traffic policing, rate limiting, and so on. More recently, CAM devices have been deployed in network environments to implement intrusion detection systems and to perform deep packet inspection tasks.

A CAM device can be instructed to compare a selected portion of an incoming packet with CAM words stored in an array within the CAM device. More specifically, a CAM device includes a CAM array having a plurality of CAM cells organized in a number of rows and columns. Each row of CAM cells, which can be used to store a CAM word, is coupled to a corresponding match line that indicates match results for the row. Each column of CAM cells is typically coupled to one or more data lines or data line pairs that can be used to drive data into a selected CAM row during write operations and/or for providing a search key to the CAM rows during compare operations. During a compare operation, the search key (e.g., the comparand word) is provided to the CAM array (e.g., via compare line pairs associated with columns of the CAM array) and compared with the CAM words stored therein. For each CAM word that matches the search key, a corresponding match line is asserted to indicate the match result, which is typically stored in a match latch associated with the matching CAM row. If one or more of the match lines are asserted, a match flag is asserted to indicate the match condition, and a priority encoder determines the match address or index of the highest priority matching (HPM) entry in the CAM array.

Some CAM devices allow for accessing a segment of CAM cells in an intra-row configurable CAM device. For example, U.S. Pat. No. 6,243,281, which is assigned to the assignee of the present application and is hereby incorporated by reference, discloses a CAM array having a plurality of rows of CAM cells in which each row is segmented into a plurality of row segments. Each row segment includes a plurality of CAM cells coupled to a corresponding match line segment. Address logic coupled to the CAM array uniquely addresses individual row segments in response to first configuration information, and uniquely addresses a group of the row segments in response to second configuration information. The first configuration information is indicative of a first width and depth configuration of the CAM array, and the second configuration information is indicative of a second width and depth configuration of the CAM array.

For the CAM device disclosed in U.S. Pat. No. 6,243,281, all match line segments in each row are typically pre-charged prior to compare operations without regard to the particular width and depth configuration of the CAM array and without regard to match results in previous row segments. During compare operations between comparand data and data stored in the CAM array, if all CAM cells in a row segment match the comparand data, the CAM cells do not discharge the corresponding match line segment, which remains in its charged state to indicate a match condition for the row segment. Conversely, if any CAM cell in the row segment does not match the comparand data, the CAM cell discharges the match line segment to indicate a mismatch condition for the row segment. The discharged match line segments are then pre-charged prior to the next compare operation.

Alternately charging and discharging all match line segments that have a mismatch condition during compare operations may result in significant power consumption. This power consumption increases as the size and/or density of the CAM array increases and, therefore, undesirably limits the memory size and the scalability of the CAM array. To reduce such power consumption, the match line segments of some row segments can be selectively pre-charged in response to match conditions in one or more previous row segments and in response to the particular row configuration of the CAM device, for example, as described in commonly-owned U.S. Pat. No. 7,113,415, which is hereby incorporated by reference. In this manner, if data stored in the CAM cells of a first segment of a CAM row does not match a corresponding portion of the search key (thus resulting in a mismatch condition for the entire row), the match lines in subsequent segments of the CAM row are not pre-charged, thereby reducing power consumption.

Although effective reducing power consumption associated with match line pre-charging, CAM devices disclosed in U.S. Pat. No. 7,113,415 typically drive the search key into all CAM row segments for each compare operation, which consumes significant power. For example, prior to compare operations, each set of compare line pairs in the CAM array are driven to the same predetermined logic level (e.g., to logic high) and then, during compare operations, the search key is provided to the CAM array by driving each pair of complementary compare lines to opposite logic states indicative of the corresponding bit of the search key. Thus, because at least one of each complementary compare pair in the CAM array is charged and discharged for every compare operation, power consumption associated with charging and discharging the compare lines can be significant. Accordingly, there is a need to minimize the power consumption associated with the pre-charging and discharging of the comparand lines in CAM arrays, and to further reduce the power consumption associated with the charging and discharging of the match lines.

DETAILED DESCRIPTION

Figure 1:
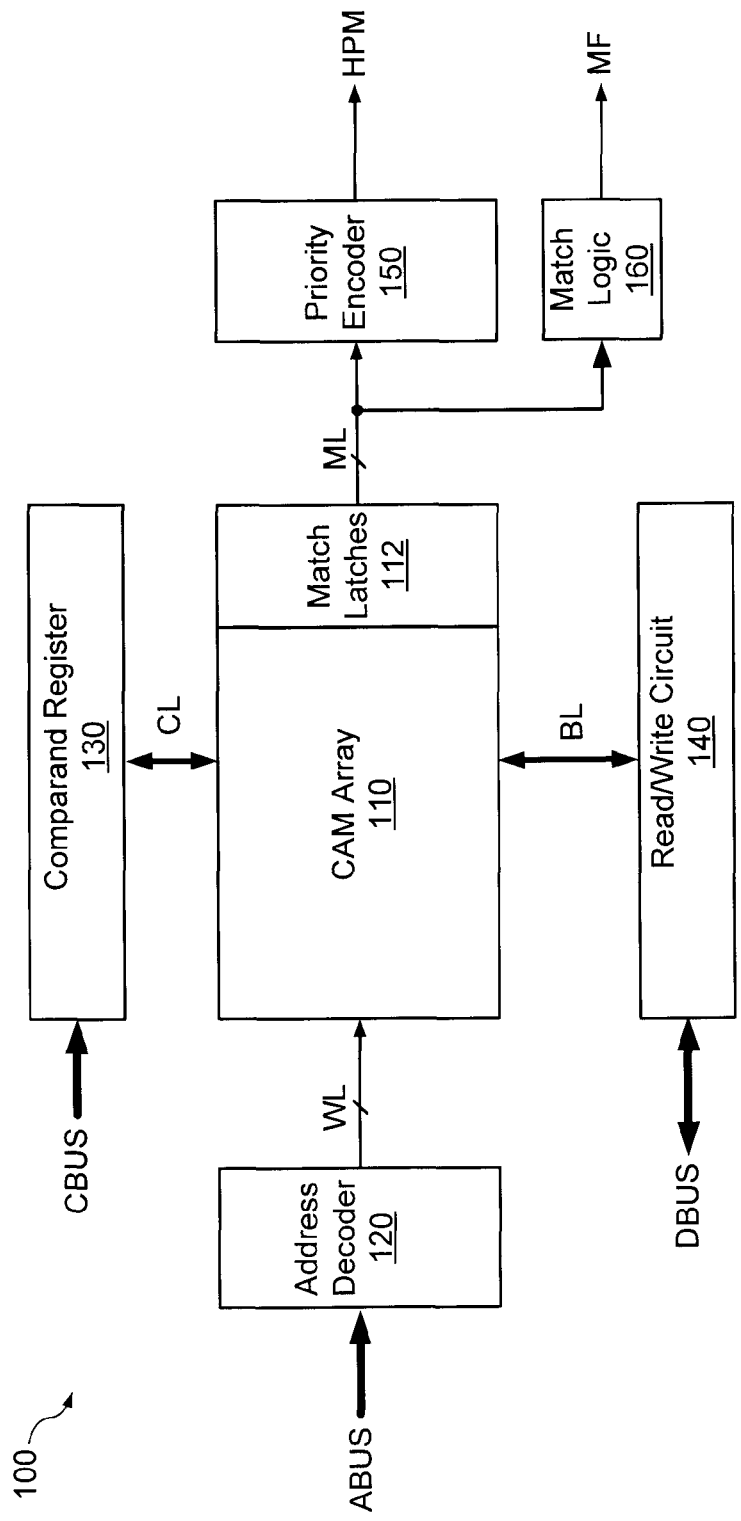
FIG. 1 is a block diagram of a CAM device that is generally representative of CAM devices within which present embodiments can be implemented.

A method and apparatus for reducing power consumption in a CAM device are discussed below. In the following description, for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present embodiments. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present disclosure is not to be construed as limited to specific examples described herein but rather includes within its scope all embodiments defined by the appended claims.

Present embodiments reduce the power consumption of a CAM device during compare operations between a search key and data stored in the device's CAM array by selectively re-using match results generated during a previous compare operation when the previous search key and the current search key contain common portions. For some embodiments, the CAM device includes a segmented CAM array divided into a plurality of array segments, with each array segment having a number of columns of CAM cells and match latch circuitry to store the match results between data stored in the array segment and a corresponding portion or segment of the search key. The CAM device also includes a search key compare circuit and an array control circuit. The search key compare circuit compares the current search key with the previous search key to generate a plurality of key match signals, and the control circuit selectively disables one or more of the array segments in response to the search key match signals for a current compare operation between the current search key and data stored in the CAM array.

More specifically, prior to the current compare operation, the current search key is compared with the previous search key to generate a plurality of key match signals, with each key match signal indicating whether corresponding portions or segments of the current search are the same as (e.g., match) corresponding portions or segments of the previous search key. For each key match signal that indicates a mismatch between corresponding portions of the current search key and the previous search key, the control circuit allows the corresponding portion of the current search key to be provided to the associated array segment for comparison with data stored therein, thereby allowing the associated array segment to participate in the current compare operation. Conversely, for each key match signal that indicates a match between corresponding portions of the current search key and the previous search key, the control circuit prevents the corresponding portion of the current search key from being provided to the associated array segment, thereby preventing the associated array segment from participating in the current compare operation, and allows the match results generated by the associated array segment in the previous compare operation to be re-used as the array segment match results for the current compare operation.

By re-using match results generated by one or more associated array segments in the previous compare operation and disabling the one or more array segments for the current compare operation, power consumption is reduced over conventional CAM arrays that do not determine when search keys used in sequential compare operations have common portions. More specifically, for each array segment that does not participate in the current compare operation, power consumption can be reduced by (1) not driving the common portion of the search keys onto the compare lines of the associated array segment(s) and (2) not pre-charging the match line segments of the associated array segment(s).

FIG. 1 is a block diagram of a CAM device 100 having an architecture generally representative of CAM devices within which the present embodiments can be implemented. CAM device 100 includes a CAM array 110, an address decoder 120, a comparand register 130, a read/write circuit 140, a priority encoder circuit 150, and match logic 160. CAM array 110 includes any number of rows of CAM cells (not shown for simplicity in FIG. 1), where each row of CAM cells can be configured to store a data word. Further, while CAM array 110 is shown in FIG. 1 as a single CAM array, it may include any number of CAM array blocks that can be independently searched.

One or more instructions and related control signals may be provided to CAM device 100 from an instruction decoder (not shown for simplicity) to control read, write, compare, and other operations for CAM device 100. Other well-known signals that can be provided to CAM device 100, such as enable signals, clock signals, and power connections, are not shown for simplicity. Further, although not shown in FIG. 1, each row of CAM cells in CAM array 110 may have one or more validity bits to indicate whether the corresponding row (or any segment thereof) of CAM cells stores valid data.

Each row of CAM cells (not shown in FIG. 1 for simplicity) in CAM array 110 is coupled to address decoder 120 via a corresponding word line WL, and to match latches 112, to priority encoder 150, and to well-known match logic 160 via a corresponding match line ML. For simplicity, the word lines and match lines are represented collectively in FIG. 1. Address decoder 120 is well-known, and includes circuitry to select corresponding rows in CAM array 110 for read, write, and/or other operations in response to an address received from an address bus ABUS using the word lines WL. For other embodiments, addresses may be provided to address decoder 120 from another suitable bus and/or circuitry.

The match lines ML provide match results for compare operations between comparand data (e.g., a search key) and data stored in CAM array 110. Priority encoder 150, which is well-known, uses the match results indicated on the match lines and latches in the match latches 112 to determine the matching entry that has the highest priority number associated with it and generates the index or address of this highest priority match (HPM). In addition, priority encoder 150 may use the validity bits from CAM array 110 to generate the next free address that is available in CAM array 110 for storing new data. Although not shown in FIG. 1, for some embodiments, priority encoder 150 may provide the next free address to the address decoder 120.

Match logic 160, which is well-known, uses the match results indicated on the match lines to generate a match flag indicative of a match condition in CAM array 110. If there is more than one matching entry in CAM array 110, match logic 160 may generate a multiple match flag to indicate a multiple match condition. In addition, match logic 160 may use the validity bits from CAM array 110 to assert a full flag when all of the rows of CAM cells in CAM array 110 are filled with valid entries.

Each column of CAM cells (not shown in FIG. 1 for simplicity) in CAM array 110 is coupled to comparand register 130 via one or more corresponding comparand lines CL, and is coupled to read/write circuit 140 via one or more corresponding bit lines BL. For simplicity, the comparand lines CL and bit lines BL are represented collectively in FIG. 1. Comparand register 130 is well-known, and is configured to provide a search key (e.g., a comparand word) received from a comparand bus CBUS to CAM array 110 during compare operations with data stored therein. For other embodiments, the search key can be provided to CAM array 110 via another bus and/or circuit. Read/write circuit 140 includes well-known write drivers to write data received from a data bus DBUS to CAM array 110 via the bit lines, and includes well-known sense amplifiers to read data from CAM array 110 onto DBUS. For other embodiments, read/write circuit 140 may be coupled to a bus other than DBUS. Further, although not shown in FIG. 1 for simplicity, CAM device 100 can include a well-known global mask circuit (e.g., coupled to the comparand register 130) that can selectively mask the bits of the search key provided to the CAM array 110.

Figure 2:
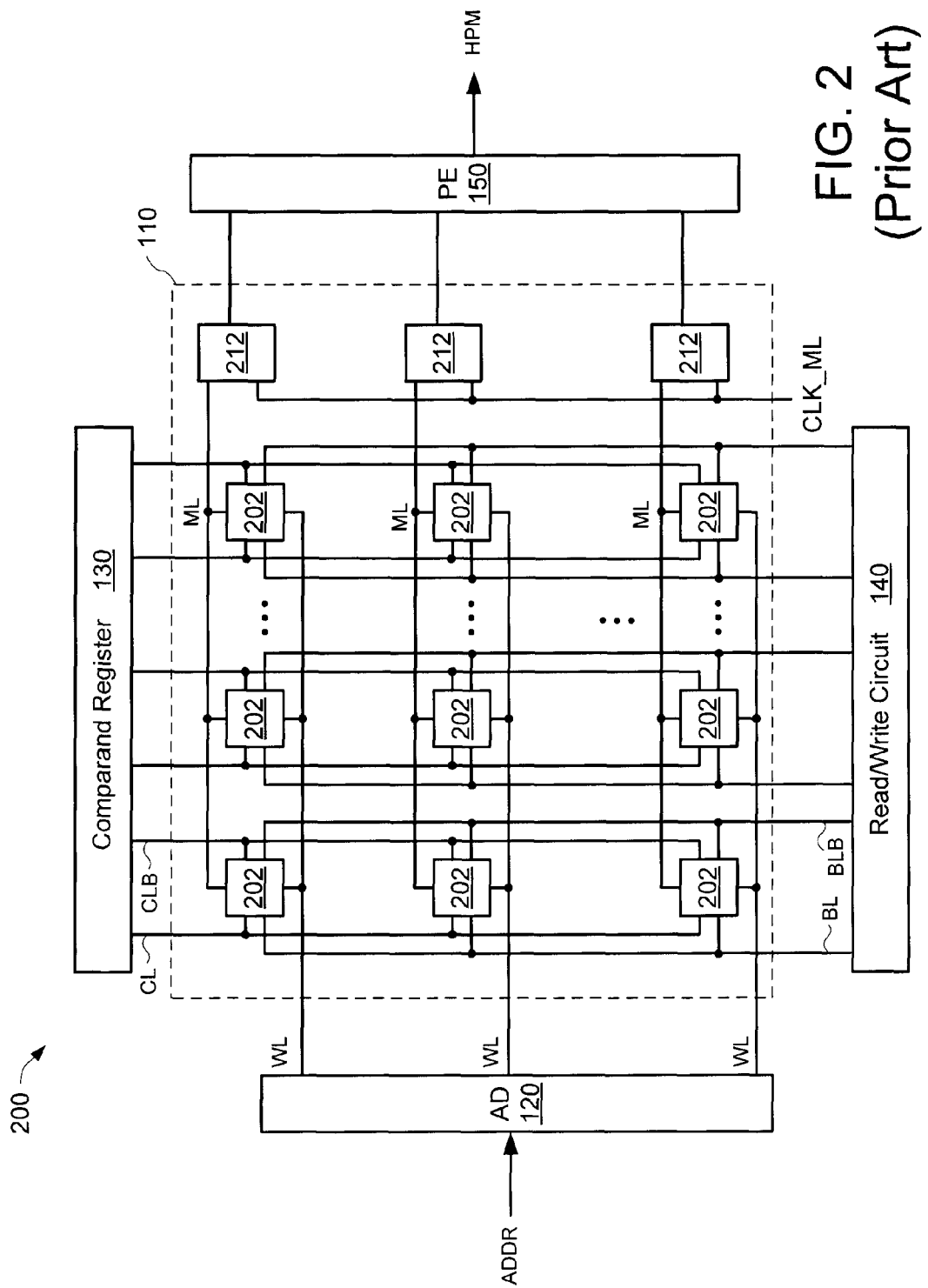
FIG. 2 is a block diagram of a portion of the CAM array of the CAM device of FIG. 1.

FIG. 2 is a more detailed block diagram of the CAM array 110 of FIG. 1. CAM array 110 is shown to include a plurality of CAM cells 202 organized in any number of rows and columns. The CAM cells 202 can be any suitable type of CAM cell including, for example, binary CAM cells, ternary CAM cells, and/or quaternary CAM cells. As noted above, each row of CAM array 110 may also include one or more validity bits. Each row of CAM cells 202 is coupled to a match line ML and to a word line WL. Each word line WL is driven by address decoder 120 (see also FIG. 1) to select one or more rows of CAM cells 202 for writing or reading. Each match line ML is coupled to priority encoder 150 via a corresponding match latch 212, which together form the match latches 112 of FIG. 1. Each column of CAM cells 202 in CAM array 110 is coupled to read/write circuit 140 via a complementary bit line pair BL/BLB, and to comparand register 130 via a complementary comparand line pair CL/CLB.

Prior to compare operations, the match lines are pre-charged (e.g., to logic high), and each set of complementary comparand line pairs CL/CLB are driven to the same predetermined logic level (e.g., to logic high). Then, during compare operations, the comparand register provides the search key (i.e., the comparand word) to the CAM cells 202 by driving each pair of complementary comparand lines CL/CLB to opposite logic states indicative of the corresponding bit of the search key. For example, to provide a logic low comparand bit to a column of CAM cells, the corresponding comparand line CL is driven to a first logic state (e.g., logic low) and the corresponding complementary comparand line CLB is driven to a second logic state (e.g., logic high); conversely, to provide a logic high comparand bit to the column of CAM cells, the corresponding comparand line CL is driven to the second logic state (e.g., logic high) and the corresponding complementary comparand line CLB is driven to the first logic state (e.g., logic low). Thereafter, if all the CAM cells 202 in a particular row match the corresponding bits of the search key, then the match line ML remains in its logic high state to indicate the match condition. Conversely, if one or more of the CAM cells 202 in the row do not match the corresponding bit of the search key, then mismatching CAM cells 202 discharge the match line (e.g., to ground potential) to indicate the mismatch condition.

Because at least one of each comparand line pair CL/CLB in the CAM array 110 is charged and discharged for every compare operation, power consumption associated with charging and discharging the comparand lines can be significant. Accordingly, there is a need to minimize the power consumption associated with the pre-charging and discharging of the comparand lines in CAM arrays.

Figure 3:
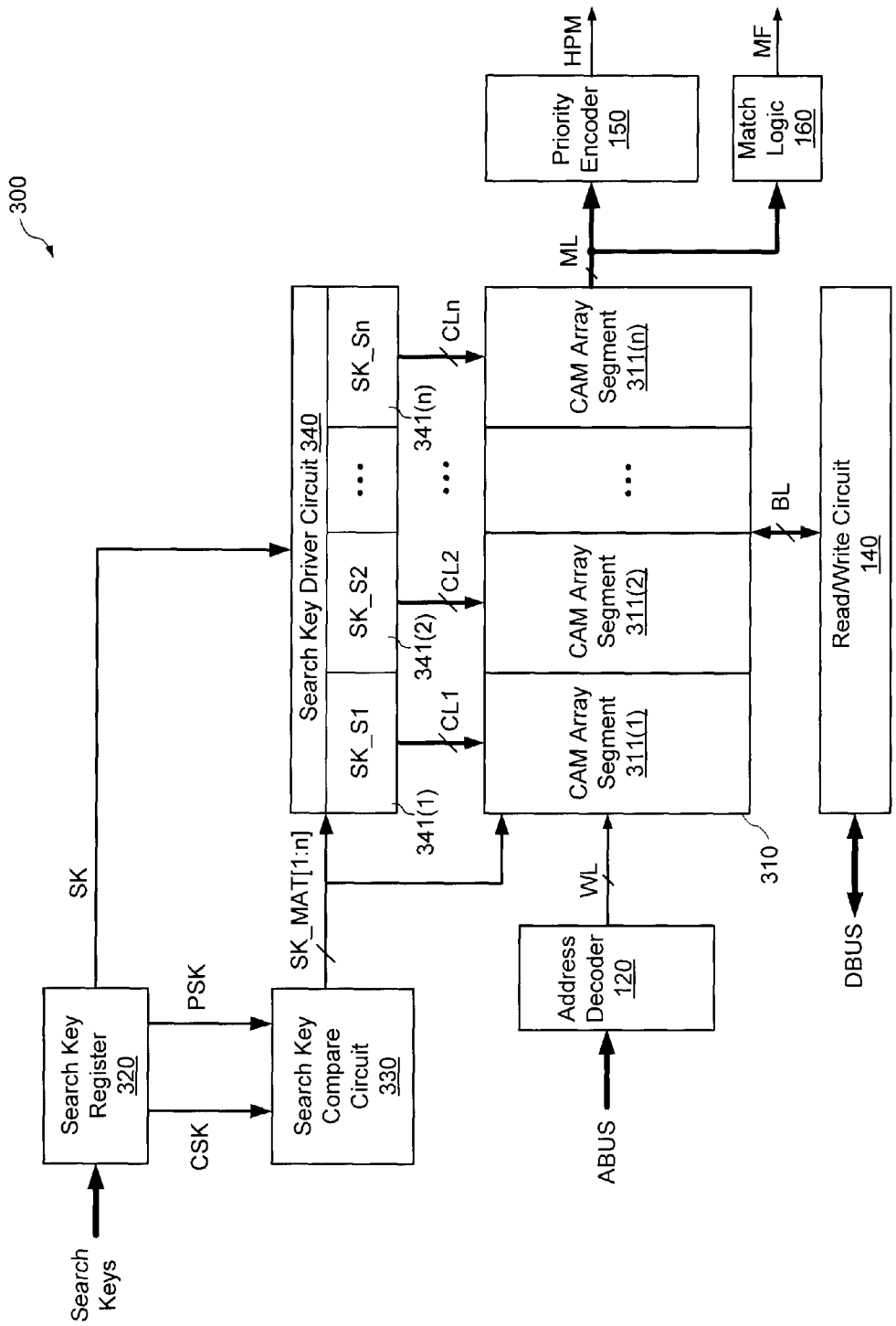
FIG. 3 is a block diagram of a CAM device configured in accordance with the present embodiments.

FIG. 3 is a block diagram of a CAM device 300 configured in accordance with present embodiments. CAM device 300 includes a CAM array 310, a search key register 320, a search key compare circuit 330, and a search key driver circuit 340, as well as address decoder 120, read/write circuit 140, priority encoder circuit 150, and match logic 160 described above with respect to FIG. 1. One or more instructions and related control signals may be provided to CAM device 300 from an instruction decoder (not shown for simplicity) to control read, write, compare, and other operations for CAM device 300. Other well-known signals that can be provided to CAM device 300, such as enable signals, clock signals, and power connections, are not shown for simplicity. Further, although not shown in FIG. 3, each row of CAM cells in CAM array 310 may have one or more validity bits to indicate whether the corresponding row (or any segment thereof) of CAM cells stores valid data.

Search key register 320 includes an input to receive search keys (e.g., from a connected network), and includes a plurality of storage locations (not shown for simplicity) to store a plurality of search keys received from the network. Search key register 320, which can be implemented using any suitable memory elements or device, also includes outputs connected to search key compare circuit 330 and to search key driver circuit 340.

Search key compare circuit 330 includes inputs to receive the current search key and the previous search key from the search key register 320, and is configured to compare the current search key with the previous search key to generate a plurality of key match signals SK1-SKn indicating whether corresponding portions or segments of the current search key and the previous search key match (e.g., are the same). For example, if the first segment of the current search key (CSK_S1) matches the first segment of the previous search key (PSK_S1), then the corresponding key match signal (SK_MAT1) is de-asserted (e.g., to logic low) to indicate the match between the corresponding search key segments. Conversely, if the first segment of the current search key (CSK_S1) does not match the first segment of the previous search key (PSK_S1), then the corresponding key match signal (SK_MAT1) is asserted (e.g., to logic high) to indicate the mismatch between the corresponding search key segments. The key match signals generated by the search key compare circuit 330 are provided as control signals to the search key driver circuit 340 and to the CAM array 310.

CAM array 310 includes a number of CAM array segments 311(1)-311(n), each of which includes a plurality of columns of CAM cells (not shown for simplicity) and match latch circuitry (not shown for simplicity in FIG. 3). Thus, each row of CAM cells in CAM array 310 is segmented into a number (n) of row segments, with each row segment including a plurality of CAM cells coupled to a corresponding match latch via a corresponding match line segment, as described in more detail with respect to FIGS. 4 and 5A. Each row of CAM cells in CAM array 310 is coupled to address decoder 120 via a corresponding word line WL, and to priority encoder 150 and match logic 160 via a corresponding match line ML. For simplicity, the word lines and match lines are represented collectively in FIG. 3.

The match lines ML provide match results for compare operations between comparand data (e.g., a search key) and data stored in CAM array 310. As described above with respect to FIG. 1, priority encoder 150 uses the match results indicated on the match lines to determine the matching entry that has the highest priority number associated with it and generates the index or address of this highest priority match (HPM), and match logic 160 uses the match results indicated on the match lines to generate a match flag indicative of a match condition in CAM array 310.

Each column of CAM cells in CAM array 310 is coupled to search key driver circuit 340 via a corresponding comparand line or line pair CL, and is coupled to read/write circuit 140 via a corresponding bit line or line pair BL. For simplicity, the comparand lines CL and bit lines BL are represented collectively in FIG. 3. During compare operations, search key driver circuit 340 selectively provides segments of the search key (SK) received from the search key register 320 to associated array segments 311 of the CAM array 310 in response to corresponding search key match signals SK_MAT, as described in more detail below. For other embodiments, the search key can be selectively provided to CAM array 310 for compare operations via another bus and/or circuit.

Read/write circuit 140 includes well-known write drivers to write data received from a data bus DBUS to CAM array 310 via the bit lines, and includes well-known sense amplifiers to read data from CAM array 310 onto DBUS. For other embodiments, read/write circuit 140 may be coupled to a bus other than DBUS. Further, although not shown in FIG. 3 for simplicity, CAM device 300 can include a well-known global mask circuit (e.g., coupled to the search key driver circuit 340 that can selectively mask the bits of the search key provided to the CAM array 310). For some embodiments, the global mask circuit stores a mask value that is logically ANDed with the search key prior to the search key being applied to the CAM array via the compare lines. For such embodiments, the search key driver circuit 340 is bypassed (e.g., disabled) when there is a global mask update. Further, for some embodiments, if any of the data entries in the CAM array 310 are updated, the search key driver circuit 340 is bypassed (e.g., disabled) for the next compare operation.

The search key driver circuit 340 includes a data input to receive the search key (e.g., the current search key) from search key register 320, and includes a plurality of array segment drivers 341(1)-341(n) that selectively drive corresponding search key segments (SK_S1 to SK_Sn) into associated CAM array segments 311(1)-311(n) in response to search key match signals SK_MAT1-SK_MATn, respectively. Thus, each array segment driver 341 is coupled to the columns of CAM cells in a corresponding array segment 311 via a corresponding set of compare lines CL, and selectively drives the associated search key segment SK_S into the corresponding array segment 311 in response to the corresponding key match signal SK_MAT. For example, the first array segment driver 341(1) selectively drives the first search key segment SK_S1 into first array segment 311(1) via compare lines CL1 in response to SK_MAT1.

Figure 4:
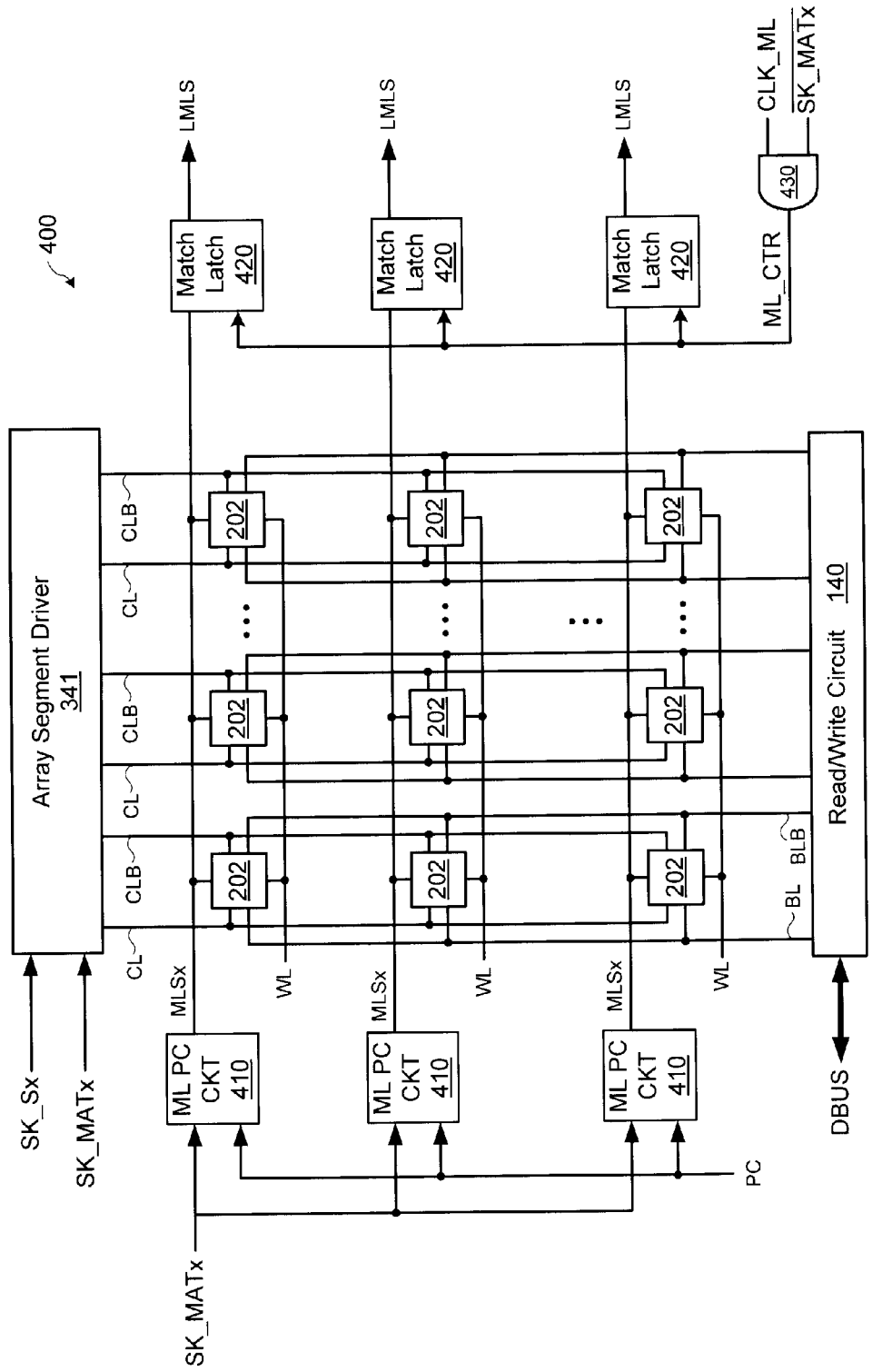
FIG. 4 is a block diagram of one of the cascaded array segments of the CAM array of FIG. 3.

FIG. 4 shows a portion of an array segment 400 that is one embodiment of the CAM array segments 311 of FIG. 3. Array segment 400 includes a plurality of CAM cells 202 arranged in a number of rows and columns. The CAM cells 202 can be any suitable type of CAM cell including, for example, binary CAM cells, ternary CAM cells, and/or quaternary CAM cells. Each row of CAM cells 202 is coupled to a match line segment MLS and to a word line WL. Each word line WL is driven by address decoder 120 (see also FIG. 1) to select one or more rows of CAM cells 202 for writing or reading. Each match line segment MLS is coupled to a corresponding match line pre-charge circuit 410 and to a corresponding match latch 420. Together, the match line pre-charge circuits 410 and the array segment drivers 341 form one embodiment of the control circuit that selectively disables one or more CAM array segments for the current compare operation in when one or more portions of the current search key match corresponding portions of the previous search key.

Each pre-charge circuit 410, which includes control terminals to receive a pre-charge signal (PC) and a search key match signal SK_MAT for the corresponding array segment, selectively pre-charges its corresponding match line segment MLS for compare operations in response to the signals PC and SK_MAT. More specifically, for some embodiments, each pre-charge circuit 410 pre-charges its corresponding match line segment MLS when PC is asserted (e.g., to logic high during a pre-charge phase of the compare operation) if the search key match signal SK_MAT is asserted to indicate that the corresponding portions of the previous and current search keys do not match, thereby enabling the CAM row segment to participate in the compare operation. Conversely, if the search key match signal SK_MAT is de-asserted to indicate that corresponding segments of the previous and current search keys match, the pre-charge circuit 410 does not pre-charge the match line segment, thereby preventing the CAM row segment from participating in the compare operation and minimizing power consumption by not pre-charging and discharging the match line segment during the compare operation.

Each match latch 420, which can be any well-known latch, register, or other memory element, selectively latches match results generated on the match line segment MLS in response to a match line control signal (ML_CTR). For exemplary embodiments described herein, the match line control signal (ML_CTR) is generated by an AND gate 430 in response to a logical AND combination of a match latch clock signal (CLK_ML) and the logical complement of the corresponding search key match signal ($\overline{SK\_MAT}$). More specifically, for some embodiments, each match latch 420 latches the match results on its associated match line segment MLS upon assertion of CLK_ML if the search key match signal SK_MAT is asserted (e.g., to logic high) to indicate that corresponding segments of the previous and current search keys do not match, thereby outputting the match results generated on MLS for the current compare operation onto the latched match line segment LMLS. Conversely, if the search key match signal SK_MAT is de-asserted (e.g., to logic low) to indicate that corresponding segments of the previous and current search keys match, the match latch 420 does not latch the current state of the match line segment MLS, but rather maintains the latched match line segment LMLS in the state indicative of the match results generated in the previous compare operation. In this manner, the match latches 420 can provide the match results generated in the previous compare operation to the priority encoder 150, thereby re-using the previous segment match results as the segment match results for the current compare operation. By re-using the segment match results from the previous compare operation, power consumption is reduced by not charging the match line segments of the CAM array segment 400.

Each column of CAM cells 202 in CAM array segment 400 is coupled to read/write circuit 140 via a complementary bit line pair BL/BLB, and to array segment driver 341 via a complementary comparand line pair CL/CLB. The array segment driver 341 selectively drives the corresponding search key segment SK_Sx into the array segment 400 via complementary comparand line pairs CL/CLB in response to the corresponding search key match signal SK_MATx. Thus, for exemplary embodiments described herein, if corresponding segments of the current search key and the previous search key do not match, as indicated by assertion of SK_MATx, then the array segment driver 341 drives the current search key segment SK_Sx into the array segment 400, thereby allowing the array segment 400 to compare the current search key segment SK_Sx with data stored therein to generate segment match results on the match line segments MLSx. Conversely, if corresponding segments of the current search key and the previous search key do not match, as indicated by assertion of SK_MATx, then the array segment driver 341 does not drive the current search key segment SK_Sx into the array segment 400, thereby preventing the array segment 400 from participating in the current compare operation. More specifically, if SK_MATx is de-asserted to indicate a match between corresponding segments of the previous and current search keys, array segment driver 341 does not drive each pair of complementary compare lines CL/CLB to opposite logic states indicative the bits of the search key, thereby reducing power consumption by not alternately charging and discharging the pairs of complementary compare lines CL/CLB of the array segment 400 between the previous compare operation and the current compare operation.

Figure 5A:
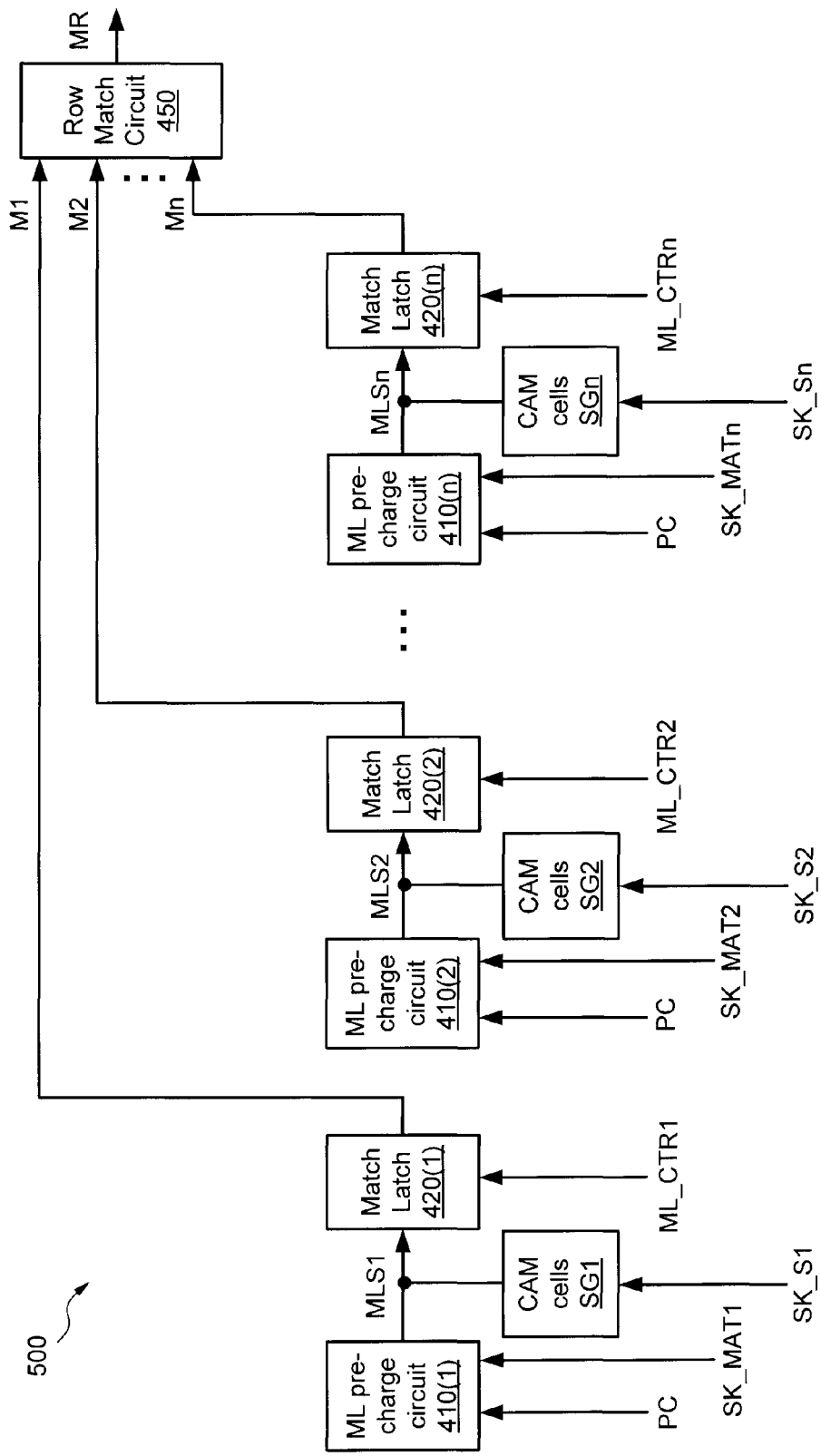
FIG. 5A is a block diagram of one of the segmented rows of the cascaded array segments of the CAM array of FIG. 3.

FIG. 5A shows a segmented CAM row 500 that is one embodiment of a row of CAM array 310 of FIG. 3. Row 500 is shown to include n row segments SG1-SGn, each including any number of CAM cells coupled to a corresponding match line segment MLS1-MLSn and configured to selectively receive a corresponding search key segment SK_S1-SK_Sn from the search key driver circuit 340. Each match line segment MLS is coupled to an output of a corresponding match line pre-charge circuit 410 and to an input of a corresponding match latch 420. Each match latch 420 latches the match results for the associated row segment during compare operations between the corresponding search key segment and data stored in the row segment's CAM cells, and provides the latched match signal to a corresponding input of row match circuit 450. As described above with respect to FIG. 4, each match latch 420 latches the match results on its ML input in response to a corresponding match line control signal ML_CTR.

More specifically, each match latch 420 can be any suitable circuit that selectively latches the logic state of its input match line segment MLS in response to the assertion of ML_CTR. For some embodiments, each match latch 420 includes logic that drives its output M to the logic state of the match line segment MLS if the corresponding ML_CTR signal is asserted, and conversely, maintains its output M in the previous state if the corresponding ML_CTR signal is de-asserted (e.g., thereby maintaining the match results from the previous compare operation). Each match latch 420 can include one or more other logic gates. For other embodiments, each match latch 420 may be a voltage level shifter (e.g., a logic gate) that adjusts the voltage level on M to appropriate logic levels for row match circuit 450.

The row match circuit 450 includes inputs to receive latched match signals M1_Mn from the match latches 420 in corresponding array segments SG1-SGn, and includes an output to generate a row match signal (MR) indicating whether there is a match condition in the CAM row 500. For some embodiments, row match circuit 450 can be an AND gate that asserts the row match signal MR only if all segment match signals M1-Mn indicate match conditions.

Figure 5B:
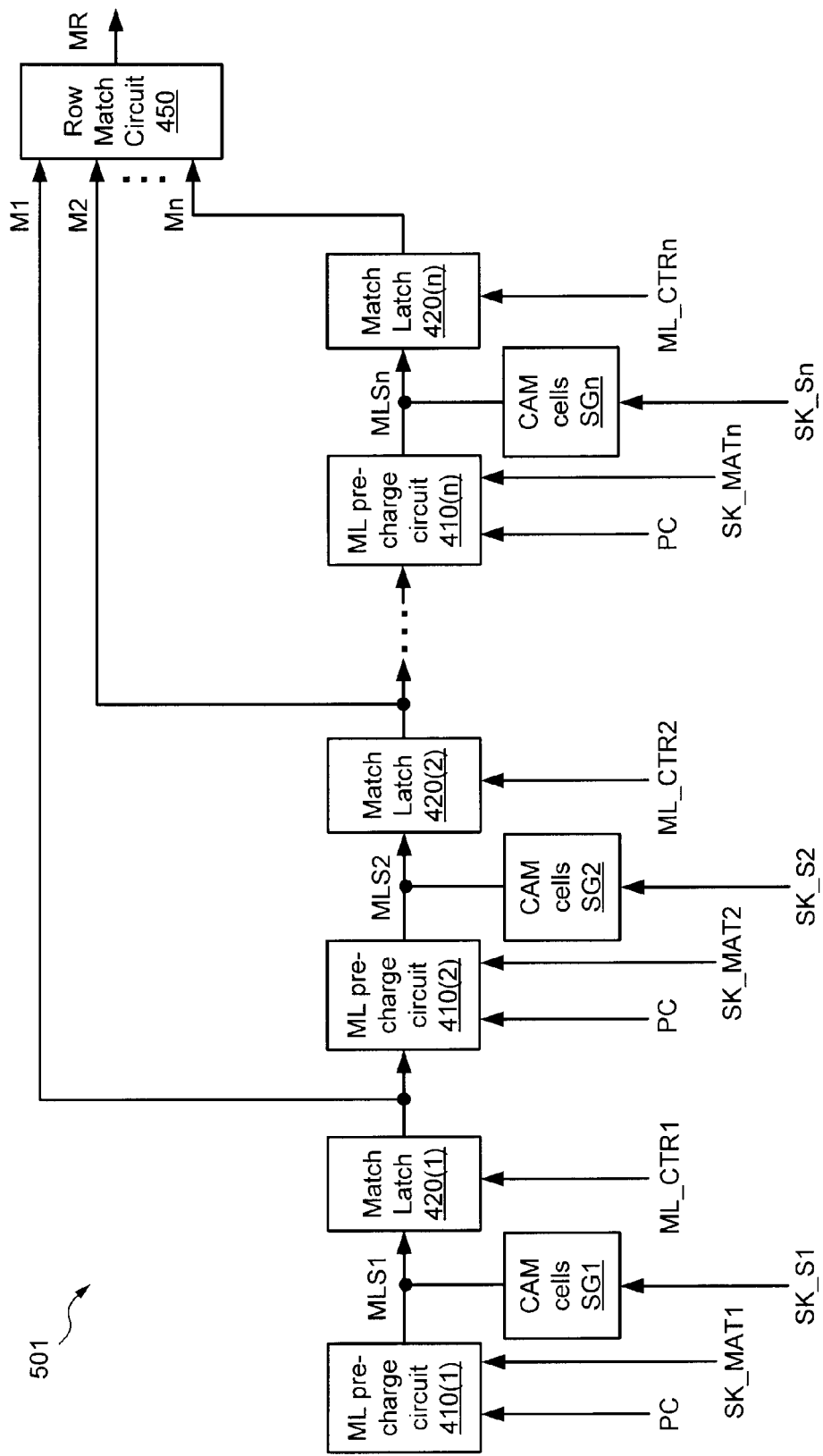
FIG. 5B is a block diagram of another of the segmented rows of the cascaded array segments of the CAM array of FIG. 3.

For other embodiments, the output of each match latch 420 can be provided as an enable signal to the match line pre-charge circuit 410 in the next row segment, for example, as depicted by the exemplary CAM row 501 shown in FIG. 5B. For the CAM row 501, which is another embodiment of the CAM rows in the array 310 of FIG. 3, the match results in a previous row segment can be used to selectively enable the next row segment for pipelined compare operations, for example, as described in commonly-owned U.S. Pat. No. 7,113,415, the entirety of which is incorporated by reference herein.

Figure 6:
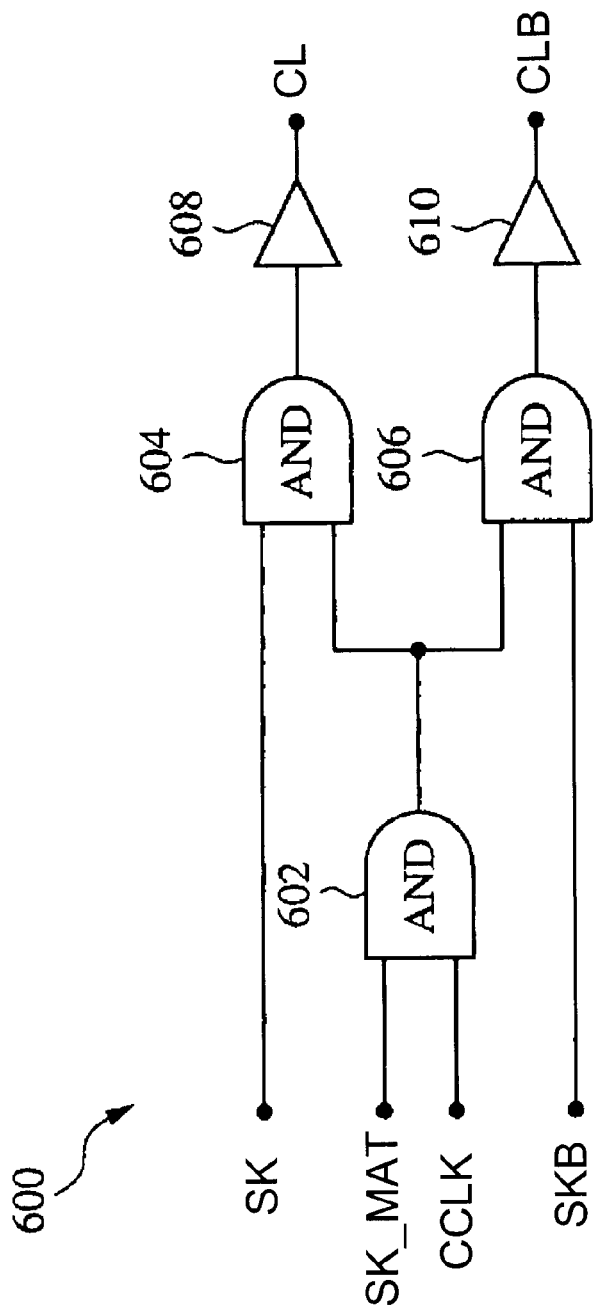
FIG. 6 is a circuit diagram of a portion of the search key driver circuit of FIG. 3.

FIG. 6 shows a 1-bit comparand driver 600 that is used in one embodiment of the search key driver circuit 340. Driver 600 includes AND gates 602, 604, and 606, and also includes buffers 608 and 610. AND gate 602 includes input terminals to receive a compare clock signal CCLK and the corresponding search key match signal SK_MAT, and an output terminal coupled to first input terminals of AND gates 604 and 606. AND gate 604 includes a second input terminal to receive a search key bit SK, and an output terminal coupled to the buffer 608, which in turn drives the comparand line CL. AND gate 606 includes a second input terminal to receive a complemented search key bit SKB, and an output terminal coupled to the buffer 610, which in turn drives the complementary comparand line CLB. Buffers 608 and 610 may be any suitable buffers to drive comparand data onto the comparand lines CL and CLB. A plurality of drivers 600 can share the AND gate 602. Although not shown in FIG. 6 for simplicity, a flip-flop can be inserted at the output terminal of AND gate 602 to latch the logically combination of signals SK_MAT and CCLK.

During a compare operation, the search key bit SK is provided to AND gate 604, and the complementary search key bit SKB is provided to AND gate 606. When CCLK is logic high, the signal SK_MAT propagates through AND gate 602 to AND gates 604 and 606. If SK_MAT is asserted to logic high, AND gate 606 passes the search key bit to the buffer 608, which in turn drives the search key bit onto the comparand line CL. Similarly, AND gate 608 passes the complementary search key bit to the buffer 610, which in turn drives the complementary search key bit onto the complementary comparand line CLB. Thus, when SK_MAT is asserted, the comparand driver 600 drives the comparand lines CL and CLB with the search key.

Conversely, if SK_MAT is de-asserted to logic low to indicate that the corresponding CAM array segment 310 is not to participate in the compare operation, AND gates 606 and 608 force their respective output terminals to logic low. In response thereto, buffers 608 and 610 force the comparand line CL and the complementary comparand line CLB, respectively, to logic low. In this manner, when SK_MAT is de-asserted, the comparand driver 600 does not drive complementary data onto the comparand lines CL and CLB, thereby precluding the corresponding CAM array segment 310 from participating in the compare operation while minimizing power consumption in the array segment.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

What is claimed is:
1. A content addressable memory (CAM) device, comprising:
 a CAM array divided into a plurality of cascaded segments, wherein each cascaded array segment includes a number of columns of CAM cells;

a search key compare circuit configured to compare a current search key with a previous search key to generate a plurality of key match signals; and a control circuit configured to selectively disable one or more of the cascaded array segments, in response to the key match signals, for a current compare operation between the current search key and data stored in the CAM array, wherein for each key match signal that indicates a match between corresponding portions of the current search key and the previous search key, the control circuit prevents a corresponding array segment from participating in the current compare operation.

2. The CAM device of claim 1, wherein each key match signal indicates whether corresponding portions of the current search key and the previous search key are the same.

3. The CAM device of claim 1, wherein the control circuit prevents the corresponding array segment from participating in the current compare operation by not driving the matching portion of the current search key into the corresponding array segment.

4. The CAM device of claim 1, wherein the control circuit prevents the corresponding array segment from participating in the current compare operation by not pre-charging any of the match lines in the corresponding array segment.

5. The CAM device of claim 1, wherein match results previously generated by the corresponding array segment in response to a previous compare operation between the previous search key and the stored data are used as match results for the corresponding array segment in the current compare operation.

6. The CAM device of claim 1, wherein the control circuit comprises:
a search key driver circuit having a data input to receive the current search key, having a plurality of control inputs to receive the key match signals, and having a plurality of outputs each coupled to a corresponding one of the array segments.

7. The CAM device of claim 6, wherein for each key match signal that indicates a match between corresponding portions of the current search key and the previous search key, the search key driver circuit prevents the matching portion of the current search key from being driven into the corresponding array segment during the current compare operation.

8. The CAM device of claim 6, wherein the control circuit comprises:
a plurality of match line pre-charging circuits, each for selectively pre-charging a number of match lines in a corresponding array segment in response to an associated key match signal.

9. The CAM device of claim 8, wherein for each key match signal that indicates a match between corresponding portions of the current search key and the previous search key, the associated match line pre-charging circuit prevents the match lines in the corresponding array segment from being pre-charged for the current compare operation.

10. The CAM device of claim 1, further comprising:
a search key register coupled to the CAM array and to the search key compare circuit, and configured to store the current search key and the previous search key.

11. A content addressable memory (CAM) device, comprising:
a search key compare circuit configured to compare first and second portions of a current search key with first and second portions of a previous search key, respectively, to generate corresponding first and second key match signals;

a CAM array including a first row segment having a number of first CAM cells coupled to a first match line segment, and including a second row segment having a number of second CAM cells coupled to a second match line segment; and a control circuit configured to selectively drive the first and second portions of the current search key into the first and second row segments, in response to the first and second key match signals, respectively, for a current compare operation between the current search key and data stored in the CAM array, wherein for each key match signal that indicates a match between corresponding portions of the current search key and the previous search key, the control circuit prevents a corresponding portion of the current search key from being driven into the associated row segment for the current compare operation.

12. The CAM device of claim 11, wherein the control circuit comprises:
a search key driver circuit having a data input to receive the current search key, having control inputs to receive the key match signals, having a first output coupled to the first row segment, and having a second output coupled to the second row segment.

13. The CAM device of claim 11, wherein the first key match signal indicates whether the first portion of the current search key matches the first portion of the previous search key, and the second key match signal indicates whether the second portion of the current search key matches the second portion of the previous search key.

14. The CAM device of claim 13, wherein for each key match signal that indicates a match between corresponding portions of the current search key and the previous search key, the control circuit also prevents the match line segment in the associated row segment from being pre-charged for the current compare operation.

15. The CAM device of claim 11, further comprising:
a first match line pre-charging circuit coupled between a supply voltage and the first match line segment and configured to selectively pre-charge the first match line segment in response to the first key match signal; and
a second match line pre-charging circuit coupled between the supply voltage and the second match line segment and configured to selectively pre-charge the second match line segment in response to the second key match signal.

16. The CAM device of claim 11, wherein if the first key match signal indicates a match between the first portions of the current search key and the previous search key, the control circuit allows match results previously generated by the first row segment in a previous compare operation between the previous search key and the stored data to be used as current match results for the first row segment in the current compare operation.

17. The CAM device of claim 11, further comprising:
a first match latch having an input to receive first match results from the first match line segment and having a control terminal responsive to the first key match signal; and
a second match latch having an input to receive second match results from the second match line segment and having a control terminal responsive to the second key match signal.

18. A content addressable memory (CAM) device, comprising:
a search key compare circuit configured to compare first and second portions of a current search key with first and second portions of a previous search key, respectively, to generate corresponding first and second key match signals;

a CAM array including a first row segment having a number of first CAM cells coupled to a first match line segment, and including a second row segment having a number of second CAM cells coupled to a second match line segment; and a control circuit configured to selectively pre-charge the first and second match line segments, in response to the first and second key match signals, respectively, for a current compare operation between the current search key and data stored in the CAM array, wherein for each key match signal that indicates a match between corresponding portions of the current search key and the previous search key, the control circuit prevents the match line segment in the associated row segment from being pre-charged for the current compare operation.

19. The CAM device of claim 18, wherein the first key match signal indicates whether the first portion of the current search key matches the first portion of the previous search key, and the second key match signal indicates whether the second portion of the current search key matches the second portion of the previous search key.

20. The CAM device of claim 18, wherein the control circuit comprises:

a first match line pre-charging circuit coupled between a supply voltage and the first match line segment and configured to selectively pre-charge the first match line segment in response to the first key match signal; and a second match line pre-charging circuit coupled between the supply voltage and the second match line segment and configured to selectively pre-charge the second match line segment in response to the second key match signal.

21. The CAM device of claim 18, wherein if the first key match signal indicates a match between the first portions of the current search key and the previous search key, the control circuit allows match results previously generated by the first row segment in a previous compare operation between the previous search key and the stored data to be used as current match results for the first row segment in the current compare operation.

22. The CAM device of claim 18, further comprising:

a first match latch having an input to receive first match results from the first match line segment and having a control terminal responsive to the first key match signal; and a second match latch having an input to receive second match results from the second match line segment and having a control terminal responsive to the second key match signal.

23. The CAM device of claim 18, wherein for each key match signal that indicates a match between corresponding portions of the current search key and the previous search key, the control circuit also prevents a corresponding portion of the current search key from being driven into the associated row segment for the current compare operation.

24. The CAM device of claim 18, further comprising:

a search key driver circuit having a data input to receive the current search key, having control inputs to receive the key match signals, having a first output coupled to the first row segment, and having a second output coupled to the second row segment.

\* \* \* \* \*